(12) United States Patent
Nishisaka et al.

(10) Patent No.: US 9,328,014 B2
(45) Date of Patent: May 3, 2016

(54) CERAMIC ELECTRONIC COMPONENT AND GLASS PASTE

(71) Applicant: Murata Manufacturing Co., Ltd., Nagaokakyo-shi, Kyoto-fu (JP)

(72) Inventors: Yasuhiro Nishisaka, Nagaokakyo (JP); Satoshi Matsuno, Nagaokakyo (JP); Tetsuya Kisumi, Nagaokakyo (JP); Yoko Okabe, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 166 days.

(21) Appl. No.: 14/191,481

(22) Filed: Feb. 27, 2014

(65) Prior Publication Data
US 2014/0292142 A1 Oct. 2, 2014

(30) Foreign Application Priority Data

Mar. 26, 2013 (JP) ................................. 2013-063354
Dec. 27, 2013 (JP) ................................. 2013-273077

(51) Int. Cl.
*H01G 4/30* (2006.01)
*C03C 8/18* (2006.01)
(Continued)

(52) U.S. Cl.
CPC *C03C 8/18* (2013.01); *H01G 4/228* (2013.01); *H01G 4/30* (2013.01); *H01L 41/0471* (2013.01); *H01L 41/0533* (2013.01); *H01C 7/008* (2013.01); *H01G 4/232* (2013.01)

(58) Field of Classification Search
CPC ......... H01G 4/30; H01G 4/228; H01G 4/232; H01G 4/2325; H01G 4/248; H01G 4/252
See application file for complete search history.

(56) References Cited

U.S. PATENT DOCUMENTS 7,510,673 B2 * 3/2009 Ohtani ..................... H01B 1/16
216/95
2003/0231457 A1 12/2003 Ritter et al.
(Continued)

FOREIGN PATENT DOCUMENTS

JP 2001-338830 A 12/2001
JP 2002-15946 A 1/2002
(Continued)

OTHER PUBLICATIONS

Official Communication issued in corresponding Korean Patent Application No. 10-2014-0034752, mailed on Aug. 18, 2015.
(Continued)

*Primary Examiner* — Dion R Ferguson
(74) *Attorney, Agent, or Firm* — Keating & Bennett, LLP

(57) ABSTRACT

A ceramic electronic component includes a ceramic body, a glass coating layer, and terminal electrodes. End portions of inner electrodes are exposed at a surface of the ceramic body. The glass coating layer covers portions of the ceramic body in which the inner electrodes are exposed. The terminal electrodes are disposed directly above the glass coating layer and are each constituted by a plating film. The glass coating layer includes a glass medium and metal powder particles that are dispersed in the glass medium and define conductive paths which electrically connect the inner electrodes and the terminal electrodes. The metal powder particles include first metal powder particles and second metal powder particles. The first metal powder particles are flat or substantially flat powder particles. The second metal powder particles are spherical or substantially spherical powder particles.

19 Claims, 14 Drawing Sheets

(51) Int. Cl.
*H01G 4/228* (2006.01)
*H01L 41/047* (2006.01)
*H01L 41/053* (2006.01)
*H01C 7/00* (2006.01)
*H01G 4/232* (2006.01)

(56) References Cited

U.S. PATENT DOCUMENTS

| | | | | |
|---|---|---|---|---|
| 2008/0239617 A1* | 10/2008 | Motoki | ............ | H01G 4/232 361/301.4 |
| 2009/0303655 A1* | 12/2009 | Ogawa | ............ | H01G 4/005 361/301.4 |
| 2014/0063684 A1* | 3/2014 | Lee | ............ | H01G 4/30 361/301.4 |

FOREIGN PATENT DOCUMENTS

| | | |
|---|---|---|
| JP | 2002-158137 A | 5/2002 |
| JP | 2002-203737 A | 7/2002 |
| JP | 2002-208535 A | 7/2002 |
| JP | 2003-323817 A | 11/2003 |
| JP | 2004-172383 A | 6/2004 |
| JP | 2004-327983 A | 11/2004 |

OTHER PUBLICATIONS

Official Communication issued in corresponding Japanese Patent Application No. 2013-273077, mailed on Feb. 23, 2016.

* cited by examiner

CERAMIC ELECTRONIC COMPONENT AND GLASS PASTE

BACKGROUND OF THE INVENTION

1. Field of the Invention

The present invention relates to a ceramic electronic component and a glass paste.

2. Description of the Related Art

Hitherto, ceramic electronic components such as ceramic capacitors have been used for electronic devices such as cellular phones and portable music players. Ceramic electronic components generally include a ceramic body having a surface at which an end portion of each of inner electrodes is exposed and outer electrodes disposed so as to cover a portion of the ceramic body in which the inner electrode is exposed. Examples of the outer electrodes include outer electrodes obtained by applying and baking a conductive paste to form a sintered metal film and plating the sintered metal film as disclosed in Japanese Unexamined Patent Application Publication No. 2002-203737 and outer electrodes formed only of a plating film as disclosed in Japanese Unexamined Patent Application Publication No. 2004-327983.

However, since the conductive paste used when such a sintered metal film is formed has high viscosity, the sintered metal film has a large thickness. For example, it is described in Japanese Unexamined Patent Application Publication No. 2002-203737 that first and second electrode layers (sintered metal films) have a thickness of about 50 µm to 90 µm.

When the outer electrodes are each formed of a sintered metal film, the baking temperature at which the conductive paste is baked is high. Therefore, the interdiffusion between a ceramic component contained in the ceramic body and a glass component in the conductive paste occurs and consequently a reaction layer may be formed at the interface between the ceramic body and the sintered metal film. A plating solution enters the ceramic body through a portion in which the reaction layer has been formed, which poses problems in that the mechanical strength of the ceramic body decreases and the moisture resistance degrades. Furthermore, an excessively high baking temperature poses a problem in that glass floating occurs through precipitation of a glass component on the surface of the sintered metal film and consequently a plating film is not easily formed on the surface of the sintered metal film.

Japanese Unexamined Patent Application Publication No. 2004-327983 proposes a method for forming an outer electrode using only a plating film. When the outer electrode is formed of only a plating film, the thickness of the outer electrode can be decreased compared with, for example, the case where an outer electrode is formed by baking a conductive paste.

Since a plating solution does not contain a glass component, the reaction layer is not formed at the interface between the ceramic body and the plating film. Therefore, problems such as a decrease in mechanical strength and a degradation of moisture resistance caused by formation of the reaction layer do not easily occur. Furthermore, a problem of glass floating and a problem in that a plating film is not easily formed do not occur.

However, when the outer electrode is formed of a plating film, the ceramic body needs to be directly immersed in a plating solution, which poses a problem in that the plating solution enters the ceramic body through an exposed portion of an inner electrode. As a result, the moisture resistance may degrade.

When the outer electrode is formed of only a plating film, the plating film and the ceramic body are not chemically bonded to each other, but only physically bonded to each other. This poses a problem in that the adhesiveness between the plating film and the ceramic body degrades. As a result, moisture or the like easily enters the ceramic body through a portion between the plating film and the ceramic body during the use of ceramic electronic components, which may degrade the moisture resistance.

SUMMARY OF THE INVENTION

Accordingly, preferred embodiments of the present invention provide a ceramic electronic component having excellent moisture resistance while maintaining a small thickness of a terminal electrode.

A ceramic electronic component according to a preferred embodiment of the present invention includes a ceramic body, a glass coating layer, and a terminal electrode. The ceramic body includes a surface at which an end portion of an inner electrode is exposed. The glass coating layer covers a portion of the ceramic body in which the inner electrode is exposed. The terminal electrode is disposed directly above the glass coating layer and constituted by a plating film. The glass coating layer includes a glass medium and metal powder particles that are dispersed in the glass medium and define conductive paths which electrically connect the inner electrode and the terminal electrode. The metal powder particles include first metal powder particles, which are flat or substantially flat powder particles, and second metal powder particles, which are spherical or substantially spherical powder particles.

In another broad aspect, a ceramic electronic component according to a preferred embodiment of the present invention includes a ceramic body including a surface at which an end portion of an inner electrode is exposed, a glass coating layer that covers a portion of the ceramic body in which the inner electrode is exposed, and a terminal electrode disposed directly above the glass coating layer and constituted by a plating film. The glass coating layer contains a glass medium and metal powder particles that are dispersed in the glass medium and define conductive paths which electrically connect the inner electrode and the terminal electrode, and the metal powder particles include first metal powder particles having an elongated or substantially elongated shape in a cross section of the glass coating layer in a thickness direction and second metal powder particles, an average of ratios (major axis/minor axis) of a major axis to a minor axis of the second metal powder particles being smaller than that of the first metal powder particles in the cross section of the glass coating layer in the thickness direction.

In a specific aspect of the ceramic electronic component according to a preferred embodiment of the present invention, an aspect ratio of the first metal powder particles in a cross section of the glass coating layer in a thickness direction is preferably about 3.6 or more, for example.

In another specific aspect of the ceramic electronic component according to a preferred embodiment of the present invention, a ratio of the second metal powder particles in the metal powder particles is preferably about 5% by volume to about 50% by volume, for example.

In still another specific aspect of the ceramic electronic component according to a preferred embodiment of the present invention, a ratio of the second metal powder particles in the metal powder particles is preferably about 8% by volume to about 35% by volume, for example.

In still another specific aspect of the ceramic electronic component according to a preferred embodiment of the present invention, at least one of the conductive paths is preferably formed by bringing the metal powder particles into contact with each other, the metal powder particles being arranged in a thickness direction of the glass coating layer.

In still another specific aspect of the ceramic electronic component according to a preferred embodiment of the present invention, the metal powder particles preferably do not contain, as a main component, a metal contained in the inner electrode as a main component.

In still another specific aspect of the ceramic electronic component according to a preferred embodiment of the present invention, the metal powder particles preferably include at least a core portion including copper.

In still another specific aspect of the ceramic electronic component according to a preferred embodiment of the present invention, the glass coating layer preferably has a thickness of about 1 μm to about 10 μm, for example.

In still another specific aspect of the ceramic electronic component according to a preferred embodiment of the present invention, the conductive paths preferably include a plurality of relatively narrow portions and a plurality of relatively thick portions.

In still another specific aspect of the ceramic electronic component according to a preferred embodiment of the present invention, a portion of the plating film in contact with the glass coating layer is preferably a copper plating film or a nickel plating film.

A glass paste according to a preferred embodiment of the present invention is a glass paste to form a glass coating layer that covers a region in which a terminal electrode of a ceramic electronic component including a ceramic body and the terminal electrode is to be disposed. The glass paste includes a glass and metal powder particles. The metal powder particles include first metal powder particles and second metal powder particles. The first metal powder particles are flat or substantially flat powder particles. The second metal powder particles are spherical or substantially spherical powder particles.

In another broad aspect, a glass paste according to a preferred embodiment of the present invention is a glass paste that forms a glass coating layer that covers a region in which a terminal electrode of a ceramic electronic component including a ceramic body and the terminal electrode is to be disposed, the glass paste including a glass and metal powder particles. The metal powder particles include first metal powder particles having an elongated or substantially elongated shape in a cross section that is to be obtained when the glass coating layer is formed and extends in a thickness direction and second metal powder particles, an average of ratios (major axis/minor axis) of a major axis to a minor axis of the second metal powder particles being smaller than that of the first metal powder particles in the cross section that is to be obtained when the glass coating layer is formed and extends in the thickness direction.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
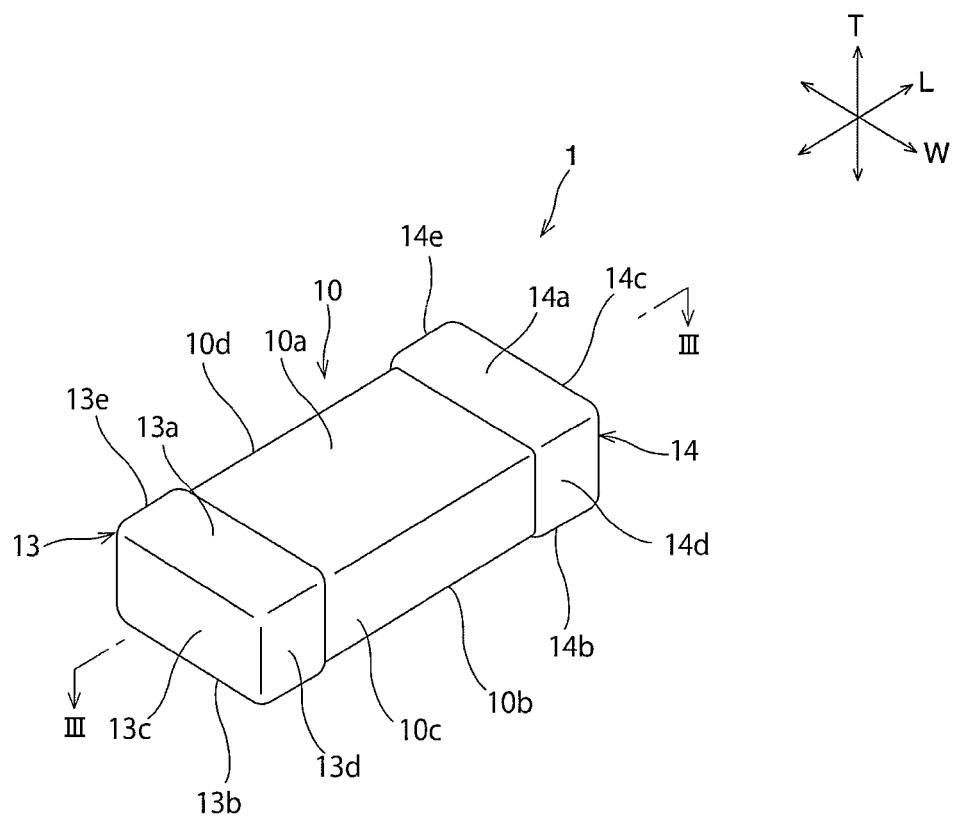
FIG. 1 is a schematic perspective view of a ceramic electronic component according to a first preferred embodiment of the present invention.

Examples of the preferred embodiments of the present invention will now be described. The following preferred embodiments are merely examples. The present invention is not limited to the following preferred embodiments.

In each of the drawings referred to in the preferred embodiments and the like, members having the same or substantially the same functions are denoted by the same reference numerals. The drawings referred to in the preferred embodiments and the like are illustrated schematically. The dimensional ratios and the like of the objects illustrated in the drawings may differ from those of the actual objects. The dimensional ratios and the like of the objects may also differ between the drawings. Specific dimensional ratios and the like of the objects are to be determined in consideration of the following description.

First Preferred Embodiment

Figure 2:
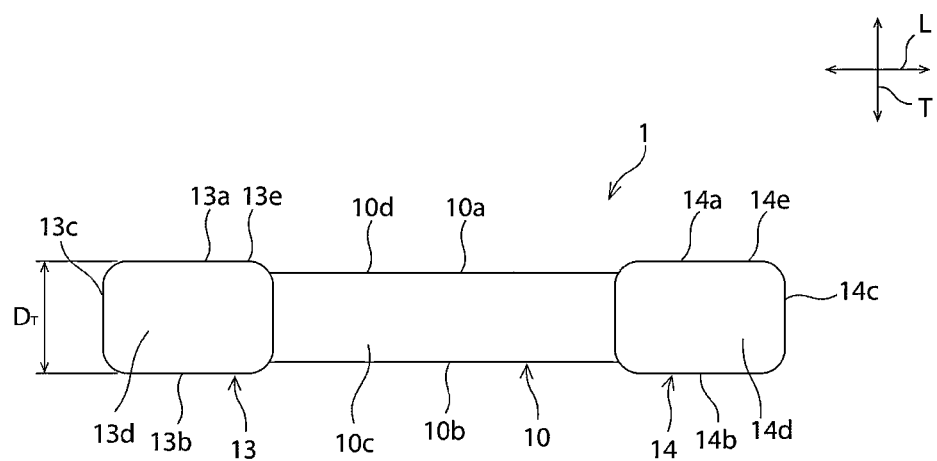
FIG. 2 is a schematic side view of the ceramic electronic component according to the first preferred embodiment of the present invention.
Figure 3:
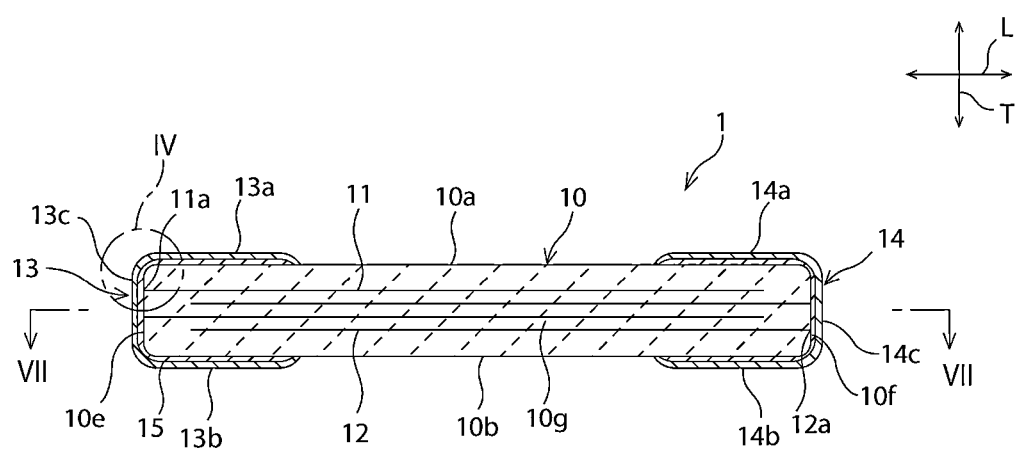
FIG. 3 is a schematic sectional view taken along line III-III of FIG. 1.
Figure 4:
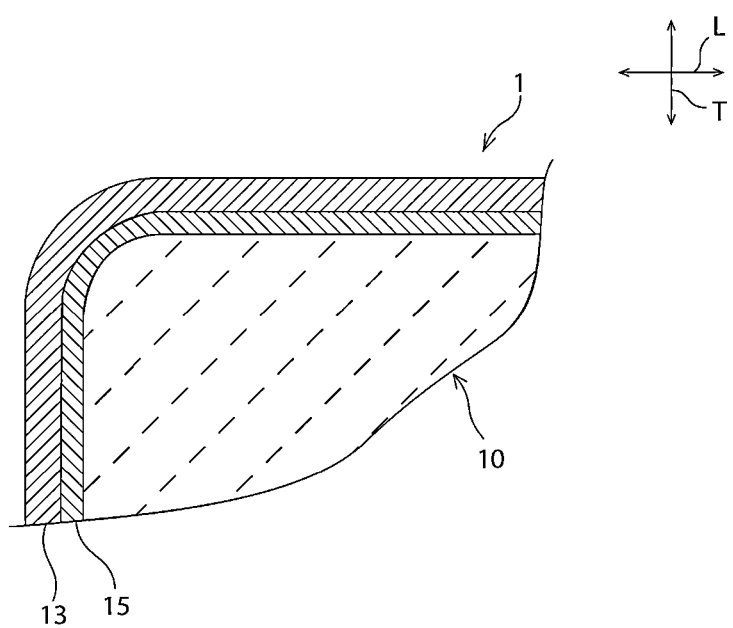
FIG. 4 is a schematic sectional view in which a portion enclosed with line IV of FIG. 3 is enlarged.
Figure 5:
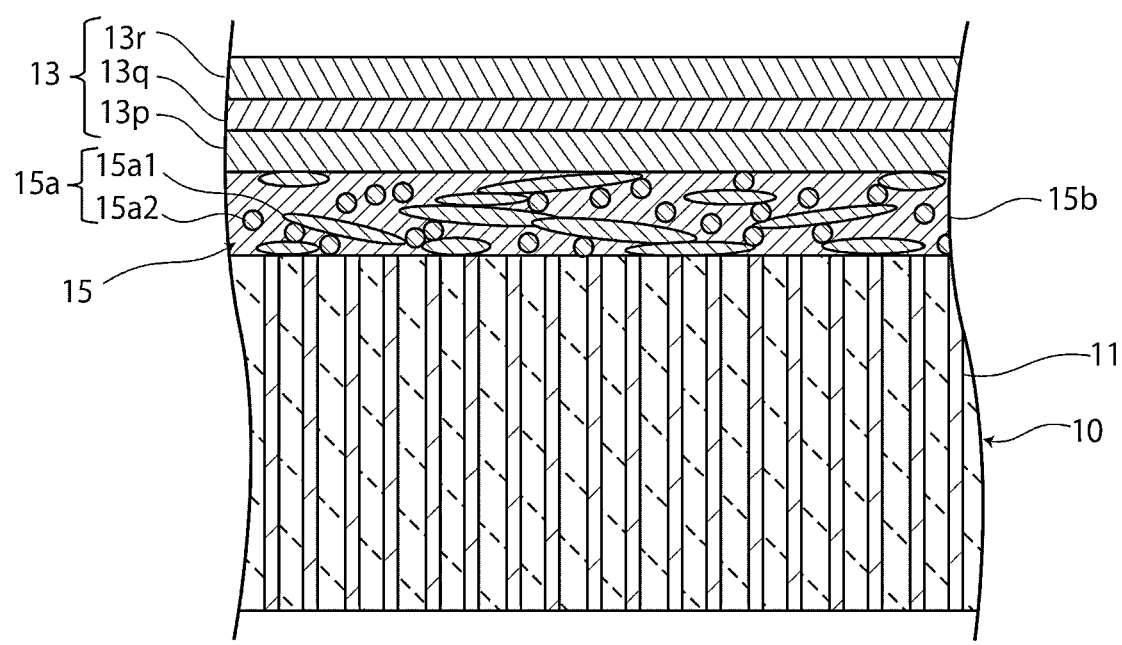
FIG. 5 is a schematic sectional view showing a glass coating layer and a first terminal electrode of a ceramic electronic component produced in the first preferred embodiment of the present invention.
Figure 7:
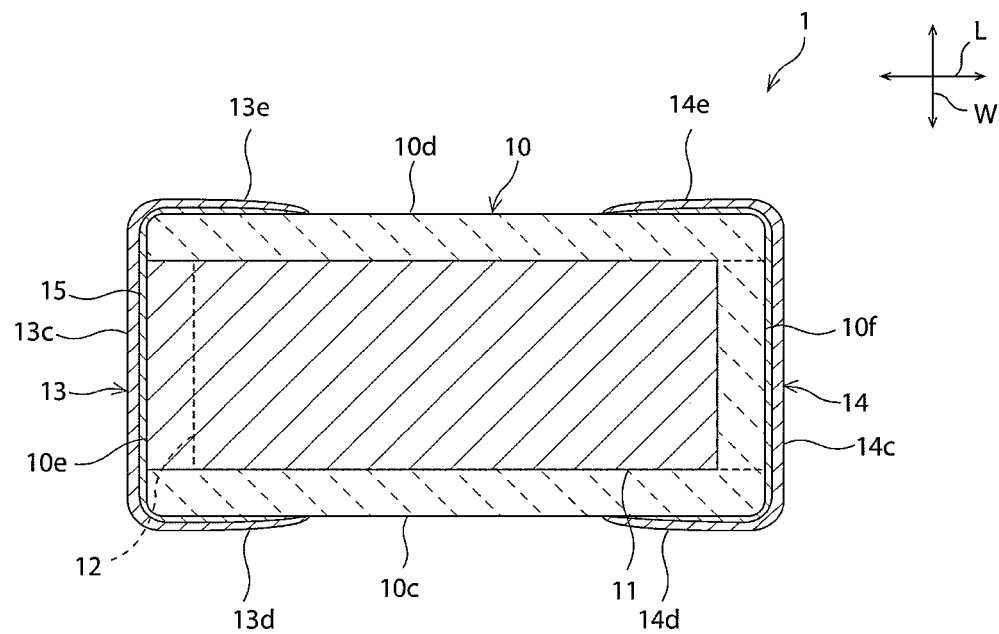
FIG. 7 is a schematic sectional view taken along line VII-VII of FIG. 3.

FIG. 1 is a schematic perspective view of a ceramic electronic component according to the first preferred embodiment of the present invention. FIG. 2 is a schematic side view of the ceramic electronic component according to this preferred embodiment. FIG. 3 is a schematic sectional view taken along line III-III of FIG. 1. FIG. 4 is a schematic sectional view in which a portion enclosed with line IV of FIG. 3 is enlarged. FIG. 5 is a schematic sectional view showing a glass coating layer and a first terminal electrode of a ceramic electronic component produced in this preferred embodiment. FIG. 7 is a schematic sectional view taken along line VII-VII of FIG. 3.

A structure of a ceramic electronic component 1 will be described with reference to FIGS. 1 to 7.

As illustrated in FIGS. 1 to 3 and 7, the ceramic electronic component 1 includes a ceramic body 10. The ceramic body 10 is composed of an appropriate ceramic material that provides the functions of the ceramic electronic component 1. Specifically, when the ceramic electronic component 1 is a capacitor, the ceramic body 10 can be composed of a dielectric ceramic material. Specific examples of the dielectric ceramic material include $BaTiO_3$, $CaTiO_3$, $SrTiO_3$, and $CaZrO_3$. When the ceramic body 10 contains a dielectric ceramic material, the ceramic body 10 contains the ceramic material as a main component and may also suitably contain additional components such as a Mn compound, a Mg compound, a Si compound, an Fe compound, a Cr compound, a Co compound, a Ni compound, and a rare-earth compound in accordance with desired characteristics of the ceramic electronic component 1.

The shape of the ceramic body 10 is not particularly limited. In this preferred embodiment, the ceramic body 10 preferably has a substantially rectangular parallelepiped shape. As illustrated in FIGS. 1 to 3, the ceramic body 10 includes first and second principal surfaces 10a and 10b that extend in the length direction L and the width direction W. As illustrated in FIGS. 1, 2, and 7, the ceramic body 10 includes first and second side surfaces 10c and 10d that extend in the thickness direction T and the length direction L. As illustrated in FIGS. 3 and 7, the ceramic body 10 includes first and second end surfaces 10e and 10f that extend in the thickness direction T and the width direction W.

In this specification, the "substantially rectangular parallelepiped shape" includes a rectangular parallelepiped whose corner portions and ridge portions are rounded. That is, a "substantially rectangular parallelepiped" member means any member having first and second principal surfaces, first and second side surfaces, and first and second end surfaces. Furthermore, depressions and projections may be formed on some or all of the principal surfaces, side surfaces, and end surfaces.

The size of the ceramic body 10 is not particularly limited. When the ceramic body 10 is assumed to have a thickness $D_T$, a length $D_L$, and a width $D_W$, the ceramic body 10 may be a thin ceramic body that approximately satisfies $D_T<D_W<D_L$, $(1/5)D_W \leq D_T \leq (1/2)D_W$, or $D_T<0.3$ mm. Specifically, $0.05 \text{ mm} \leq D_T < 0.3 \text{ mm}$, $0.4 \text{ mm} \leq D_L \leq 1 \text{ mm}$, and $0.3 \text{ mm} \leq D_W \leq 0.5 \text{ mm}$ may be approximately satisfied.

As illustrated in FIGS. 3 and 7, the ceramic body 10 includes a plurality of first and second inner electrodes 11 and 12 each preferably having a substantially rectangular shape and alternately disposed at regular intervals in the thickness direction T. End portions 11a and 12a of the respective first and second inner electrodes 11 and 12 are exposed at the surfaces of the ceramic body 10. Specifically, the end portion 11a, which is one of end portions of the first inner electrode 11, is exposed at the first end surface 10e of the ceramic body 10. The end portion 12a, which is one of end portions of the second inner electrode 12, is exposed at the second end surface 10f of the ceramic body 10.

The first and second inner electrodes 11 and 12 are parallel or substantially parallel to the first and second principal surfaces 10a and 10b. The first and second inner electrodes 11 and 12 face each other with a ceramic portion 10g disposed therebetween in the thickness direction T.

The thickness of the ceramic portion 10g is not particularly limited. The ceramic portion 10g can have a thickness of, for example, about 0.5 µm to about 10 µm. The thicknesses of the first and second inner electrodes 11 and 12 are also not particularly limited. The first and second inner electrodes 11 and 12 can each have a thickness of, for example, about 0.2 µm to about 2 µm.

The first and second inner electrodes 11 and 12 can be composed of an appropriate conductive material. For example, the first and second inner electrodes 11 and 12 can be composed of a metal such as Ni, Cu, Ag, Pd, or Au or an alloy containing at least one of the foregoing metals, such as a Ag—Pd alloy.

As illustrated in FIG. 4, glass coating layers 15 are disposed on the surface of the ceramic body 10. The glass coating layers 15 cover portions of the ceramic body 10 in which the first and second inner electrodes 11 and 12 are exposed. Specifically, the glass coating layers 15 are disposed on the first and second end surfaces 10e and 10f of the ceramic body 10, on both end portions of the first and second principal surfaces 10a and 10b in the length direction L, and on both end portions of the first and second side surfaces 10c and 10d in the length direction L.

Figure 6:
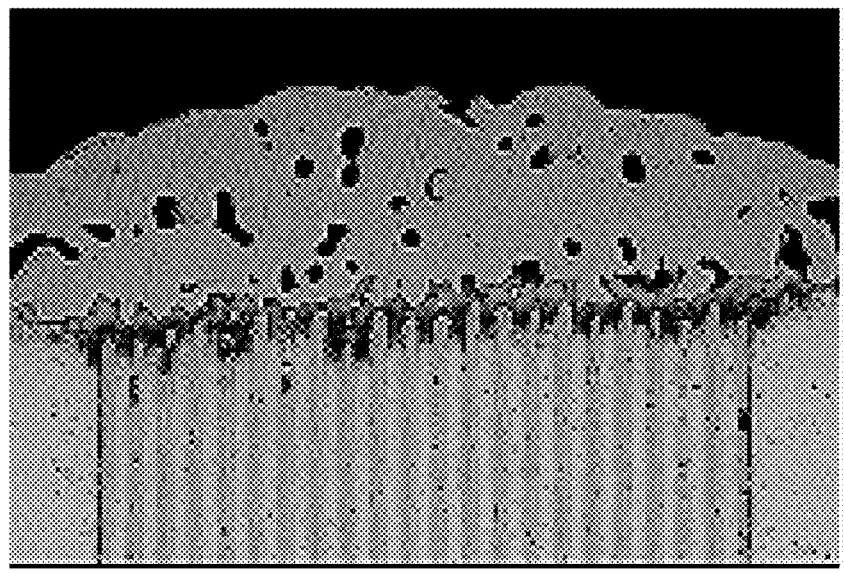
FIG. 6 is a sectional photograph of a sintered metal film formed by firing a conductive paste layer.

As illustrated in FIGS. 5 and 6, a glass medium 15b and metal powder particles 15a are fixed in each of the glass coating layers 15. In other words, the glass coating layer 15 is a composite film preferably formed by integrally fixing the glass medium 15b and the metal powder particles 15a. The glass medium 15b in the glass coating layer 15 is formed by melting a glass powder for forming the glass medium 15b through a heat treatment at a softening point thereof or higher and then solidifying the melted glass powder. Thus, the glass medium 15b is present so that gaps between the metal powder particles 15a are filled with the glass medium 15b. Similarly, the glass medium 15b seals the surface of the ceramic body 10 as a result of the solidification of the glass powder for forming the glass medium 15b. Therefore, the ceramic body 10 and the glass coating layer 15 are fixed to each other with strong and close adhesion. Furthermore, since the glass medium 15b on the surface of the ceramic body 10 is dense, the moisture resistance is improved.

The content of the glass medium 15b in the glass coating layer 15 is preferably about 35% to about 75% by volume and more preferably about 40% to about 50% by volume, for example. If the content of the glass medium 15b in the glass coating layer 15 is less than about 35% by volume, the effect of improving the moisture resistance of the ceramic electronic component 1 due to the presence of the glass coating layer 15 may decrease. If the content of the glass medium 15b in the glass coating layer 15 is more than about 75% by volume, it may be difficult to form the first and second terminal electrodes 13 and 14 directly above the glass coating layer 15. The glass of the glass medium 15b preferably contains at least one network forming oxide selected from the group consisting of $B_2O_3$ and $SiO_2$ and at least one network modifying oxide selected from the group consisting of $Al_2O_3$, ZnO, CuO, $Li_2O$, $Na_2O$, $K_2O$, MgO, CaO, BaO, $ZrO_2$, and $TiO_2$.

The glass of the glass medium 15b preferably contains, as a network modifying oxide, an oxide of the same metal as the metal powder particles 15a of the glass coating layer 15. This increases the wettability of the glass powder in the glass coating layer 15 with the metal powder particles 15a in the glass coating layer 15.

The glass of the glass medium 15b preferably contains $SiO_2$ as a component with the highest content. The content of $SiO_2$ in the entire glass is preferably about 35 mol % or more, for example.

In the glass coating layer 15, the metal powder particles 15a are dispersed in the glass medium 15b. The metal powder particles 15a contain first metal powder particles 15a1 and second metal powder particles 15a2. The metal powder particles 15a are preferably constituted by the first metal powder particles 15a1 and the second metal powder particles 15a2.

The first metal powder particles 15a1 are flat or substantially flat powder particles. The first metal powder particles 15a1 have an elongated or substantially elongated shape in a cross section of the glass coating layer 15 in the thickness direction T. The term "substantially elongated shape" in this specification refers to a shape having a major axis and a minor axis. The first metal powder particles 15a1 preferably have at least one shape selected from a flat or substantially flat shape, a scaly or substantially scaly shape, a rod-liked or substantially rod-like shape, and a needle-like or substantially needle-like shape in the cross section of the glass coating layer 15 in the thickness direction T.

In the cross section of the glass coating layer 15 in the thickness direction T, the first metal powder particles 15a1 preferably have an aspect ratio of about 3.6 or more, for example. In this specification, the aspect ratio is a ratio of a major axis to a minor axis of the metal powder particles 15a.

Figure 8:
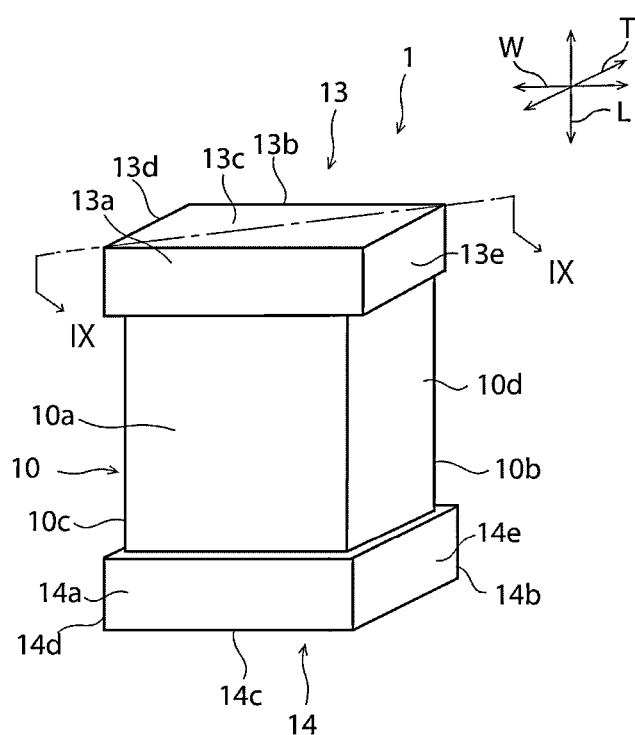
FIG. 8 is a schematic view for describing a method for measuring the aspect ratio of metal powder particles in various preferred embodiments of the present invention.
Figure 9:
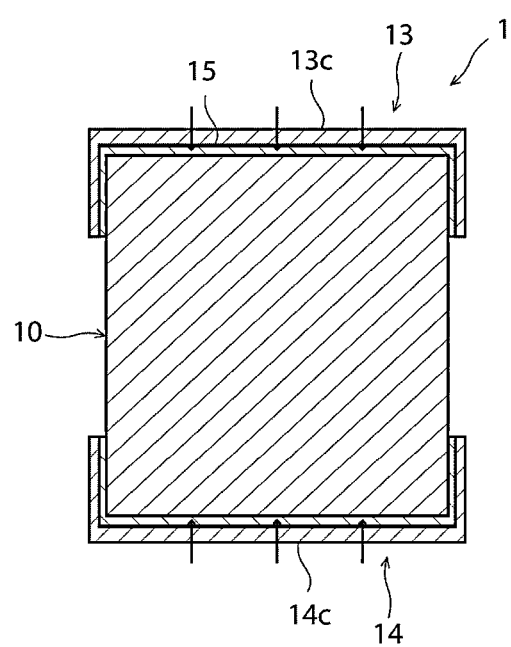
FIG. 9 is a schematic sectional view taken along line IX-IX of FIG. 8.

In the present invention, "the aspect ratio of metal powder particles" is measured by the following method. First, polishing is performed from the ridge portion of the ceramic electronic component 1 toward a diagonal line IX-IX of the surface of a third portion 13c of the first terminal electrode 13 illustrated in FIG. 8 in order to expose a cross section of the glass coating layer 15 as illustrated in FIG. 9. The cross section is then divided into four equal parts in the direction of the line IX-IX as illustrated in FIG. 9, and the glass coating layer 15 is observed at three boundaries of the four equal portions using a scanning electron microscope (SEM) with a magnification of 5000 times at an acceleration voltage of 15 kV. In the SEM observation at each of the three boundaries, the diameters of all the metal powder particles 15a contained in a field of view of 30 μm×30 μm are measured on the exposed cross section, and the maximum diameter among the measured diameters is used as a major axis length. The maximum thickness in a direction of an axis that is perpendicular to the major axis of the selected metal powder particle 15a is used as a minor axis length. The major axis length is divided by the minor axis length to calculate the aspect ratio of the metal powder particle 15a. Similarly, as indicated by arrows in FIG. 9, the aspect ratios of the metal powder particles 15a are also calculated in the glass coating layer 15 on the third portion 14c side of the second terminal electrode 14. The average of the six aspect ratios of the metal powder particles 15a in total, the six aspect ratios being calculated in both the glass coating layers 15 on the first and second terminal electrodes 13 and 14 sides, is defined to be an aspect ratio of the metal powder particles 15a in various preferred embodiments of the present invention. In the SEM observation, if a plurality of metal powder particles 15a are in contact with each other in the major axis direction and a single integrated metal powder particle 15a is observed, the major axis of such a single integrated body including the plurality of metal powder particles 15a is defined to be a major axis of a single metal powder particle 15a.

The average particle diameter of the first metal powder particles 15a1 is preferably about 0.5 μm to about 10 μm, for example. In various preferred embodiments of the present invention, the average particle diameter of the metal powder particles 15a is an average of the sum of the major axis lengths and minor axis lengths of six metal powder particles 15a measured by the above-described method (a value obtained by dividing the sum by 12).

The second metal powder particles 15a2 are spherical or substantially spherical powder particles. In the cross section of the glass coating layer 15 in the thickness direction T, the average of the aspect ratios (major axis/minor axis ratios) of the second metal powder particles 15a2 is smaller than that of the first metal powder particles 15a1. In this case, the second metal powder particles 15a2 easily enter the gaps between the first metal powder particles 15a1. Consequently, the first metal powder particles 15a1 are electrically connected to each other with more certainty. In other words, the electrical connection in the glass coating layer 15 is further ensured.

The aspect ratio of the second metal powder particles 15a2 is preferably less than about 3.6 and more preferably about 1.5 or less, for example. In this case, the second metal powder particles 15a2 easily enter the gaps between the first metal powder particles 15a1. Consequently, the first metal powder particles 15a1 are electrically connected to each other with more certainty. In other words, the electrical connection in the glass coating layer 15 is further ensured.

The average particle diameter of the second metal powder particles 15a2 is preferably about 0.2 μm to about 1.7 μm and more preferably about 0.2 μm to about 1.0 μm, for example.

The ratio of the second metal powder particles 15a2 in the metal powder particles 15a is preferably about 5% to about 50% by volume and more preferably about 8% to about 35% by volume, for example. If the ratio of the second metal powder particles 15a2 is excessively low, the contact area between the metal powder particles 15a in the glass coating layer 15 decreases, which may degrade the electrical connection in the glass coating layer 15. If the ratio of the second metal powder particles 15a2 is excessively high, it becomes difficult for the first metal powder particles 15a1 to be present at the surface of the glass coating layer 15, which may decrease the coverage of the glass coating layer 15 with plating films constituting first and second terminal electrodes 13 and 14 described below.

The content of the metal powder particles 15a in the glass coating layer 15 is preferably about 25% to about 65% by volume and more preferably about 50% to about 60% by volume, for example. The metal powder particles 15a are composed of, for example, a metal such as Cu, Ni, Ag, Pd, or Au or an alloy containing at least one of the foregoing metals, such as a Ag—Pd alloy. The metal powder particles 15a preferably do not contain, as a main component, a metal contained in the first and second inner electrodes 11 and 12 as a main component. If the metal powder particles 15a contain a metal contained in the first and second inner electrodes 11 and 12 as a main component, the content of the metal is preferably about 10% by volume or less relative to the entire volume of the metal powder particles 15a, for example. The metal powder particles 15a preferably have a core portion composed of Cu.

The glass coating layer 15 is different from a sintered metal film that is formed of a sintered metal and glass through firing of a conductive paste layer. The glass medium 15b is continuously formed in the glass coating layer 15 so that gaps between the metal powder particles 15a are filled with the glass medium 15b whereas a metal matrix is formed in the sintered metal film. In the glass coating layer 15, not all the metal powder particles 15a are integrally sintered, and the glass medium 15b is present so that gaps between the metal powder particles 15a are filled with the glass medium 15b. On the other hand, in the case of the sintered metal film, glass is present at the interface between the sintered metal film and the ceramic body as illustrated in a photograph of FIG. 6 because a glass component is brought to the interface between the sintered metal film and the ceramic body from the inside of the sintered metal film as a result of sintering of metal powder particles. Although not confirmed from FIG. 6, glass may be present on the surface of the sintered metal film because a glass component is brought to the surface of the sintered metal film from the inside of the sintered metal film as a result of sintering of metal powder particles. In the sintered metal film formed by firing a conductive paste layer, substantially all metal powder particles are sintered and thus substantially no unsintered metal powder particles are left.

The metal powder particles 15a form conductive paths that electrically connect the first and second inner electrodes 11 and 12 to the first and second terminal electrodes 13 and 14, respectively. At least one of the conductive paths is preferably formed by bringing a plurality of metal powder particles 15a into contact with each other, the metal powder particles 15a being arranged in the thickness direction T of the glass coating layer 15.

In the cross section of the glass coating layer 15 in the thickness direction T, the surfaces of the metal powder particles 15a that define the conductive paths may be nonlinear. The conductive paths may preferably include a plurality of relatively narrow portions and a plurality of relatively thick portions.

The major axis length of the first metal powder particles 15a1 that define the conductive paths is preferably larger than or equal to the thickness of the glass coating layer 15 and more preferably about 1.5 times or more the thickness of the glass coating layer 15.

The glass coating layer 15 preferably has a thickness of about 1 μm to about 10 μm, for example. If the glass coating layer 15 has a thickness of less than about 1 μm, the effect of improving the moisture resistance of the ceramic electronic component 1 due to the presence of the glass coating layer 15 may decrease. If the glass coating layer 15 has a thickness of more than about 10 μm, the absolute quantity of glass contained in the glass coating layer 15 increases. This easily causes the liquid phase diffusion of components of the first and second inner electrodes 11 and 12 into molten glass of the glass coating layer 15. In such a case, the tips of the first and second inner electrodes 11 and 12 become narrow and gaps are formed between the first and second inner electrodes 11 and 12 and the ceramic portion 10g, which may degrade the moisture resistance of the ceramic electronic component 1.

The thickness of the glass coating layer 15 can be measured by, for example, the following method. That is, the first side surface 10c of the ceramic electronic component 1 is polished in the width direction W until the cross section of the central portion (½W) of the ceramic electronic component 1 appears, and the thickness of the glass coating layer 15 located at the center of the end surface of the terminal electrode in the obtained cross section is observed with an optical microscope.

Parts of the first and second inner electrodes 11 and 12 may protrude from the surface of the ceramic body 10 and enter the glass coating layers 15, but preferably do not penetrate through the glass coating layers 15.

The first terminal electrode 13 is disposed directly above the glass coating layer 15. The first terminal electrode is electrically connected to the first inner electrode 11 through the conductive paths formed in the glass coating layer 15. The first terminal electrode 13 includes a first portion 13a located on the first principal surface 10a, a second portion 13b located on the second principal surface 10b, a third portion 13c located on the first end surface 10e, a forth portion 13d located on the first side surface 10c, and a fifth portion 13e located on the second side surface 10d.

The second terminal electrode 14 is disposed directly above the glass coating layer 15. The second terminal electrode is electrically connected to the second inner electrode 12 through the conductive paths provided in the glass coating layer 15. The second terminal electrode 14 includes a first portion 14a located on the first principal surface 10a, a second portion 14b located on the second principal surface 10b, a third portion 14c located on the second end surface 10f, a forth portion 14d located on the first side surface 10c, and a fifth portion 14e located on the second side surface 10d.

The first and second terminal electrodes 13 and 14 each preferably include a plating film. The plating film is preferably composed of at least one metal selected from the group consisting of Cu, Ni, Sn, Pd, Au, Ag, Pt, Bi, and Zn or an alloy containing at least one of the foregoing metals. The first and second terminal electrodes 13 and 14 each ma preferably include a single plating film or two or more plating films. For example, the first and second terminal electrodes 13 and 14 may have a two-layer structure of Ni—Sn or a three-layer structure of Cu—Ni—Sn. In this preferred embodiment, as illustrated in FIG. 5, the first and second terminal electrodes 13 and 14 each preferably include a first layer 13p composed of Cu, a second layer 13q composed of Ni, and a third layer 13r composed of Sn.

The total thickness of the glass coating layer 15 and the first terminal electrode 13 and the total thickness of the glass coating layer 15 and the second terminal electrode 14 are each preferably about 15 μm to about 25 μm, for example.

An example of a method for producing the ceramic electronic component 1 according to this preferred embodiment will now be described.

Figure 10:
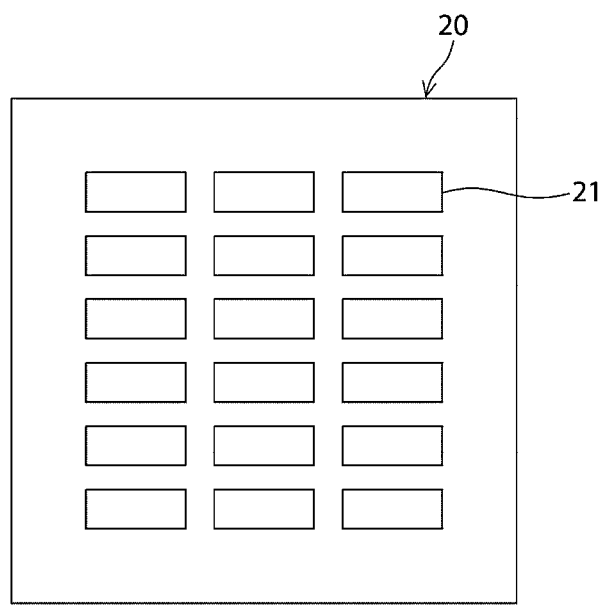
FIG. 10 is a schematic plan view of a ceramic green sheet on which a conductive pattern has been formed.

A ceramic green sheet 20 containing a ceramic material and used to form a ceramic body 10 is prepared (refer to FIG. 10). As illustrated in FIG. 10, a conductive paste is then applied onto the ceramic green sheet 20 to form a conductive pattern 21. The conductive paste can be applied by, for example, a printing method such as a screen printing method. The conductive paste contains conductive fine particles and may further contain a publicly known binder or solvent.

Subsequently, a plurality of ceramic green sheets 20 on which the conductive pattern 21 is not formed, a ceramic green sheet 20 on which the conductive pattern 21 having a shape corresponding to the first or second inner electrode 11 or 12 has been formed, and a plurality of ceramic green sheets 20 on which the conductive pattern 21 is not formed are stacked in that order and pressed in the stacking direction to produce a mother multilayer body.

Subsequently, a plurality of green ceramic multilayer bodies are produced from the mother multilayer body by cutting the mother multilayer body along an imaginary cutting line.

The mother multilayer body can be cut by dicing or press-cutting. The green ceramic multilayer bodies may be subjected to barrel polishing or the like to round the ridge portions and corner portions.

Subsequently, each of the green ceramic multilayer bodies is fired. In this firing step, the first and second inner electrodes 11 and 12 are fired. The firing temperature can be appropriately set in accordance with the types of ceramic material and conductive paste used. The firing temperature is, for example, about 900° C. to about 1300° C.

Subsequently, a glass paste is applied onto the fired ceramic multilayer body by dipping or the like. Glass is then melted through the heat treatment of the glass paste and cooled to form a glass medium 15b such that the metal powder particles 15a and the glass medium 15b are fixed. Thus, a glass coating layer 15 is provided. The glass paste used to form the glass coating layer 15 contains glass, metal powder particles 15a, a binder, a solvent, and the like. The glass powder particles having a particle diameter smaller than that of the metal powder particles 15a are preferably used as the glass. The heat treatment temperature is preferably a temperature which is higher than or equal to the softening point of the glass powder particles and at which the metal powder particles 15a are not sintered. For example, the heat treatment temperature is preferably about 600° C. to about 750° C., for example. If the heat treatment temperature is lower than about 600° C., the glass is not softened, which may degrade the adhesiveness with the ceramic body 10. If the heat treatment temperature is higher than about 750° C., a reaction between the ceramic body 10 and the glass coating layer 15 starts and the glass coating layer 15 may disappear. Furthermore, a ceramic component in the ceramic body 10 diffuses into the glass in the glass coating layer 15 and a reaction layer is formed near the surface of the ceramic body 10, which may degrade the mechanical strength of the ceramic body 10. This may be because the reaction layer is easily dissolved with a plating solution and thus chemical erosion occurs when a plating film is formed on the glass coating layer 15.

Subsequently, the glass coating layer 15 is plated to form first and second terminal electrodes 13 and 14. Through the above processes, a ceramic electronic component 1 can be produced.

An example in which non-limiting samples of the ceramic electronic component 1 according to this preferred embodiment were actually produced will now be described.

Size of ceramic body (design value): L×W×T=1.0 mm×0.5 mm×0.11 mm
Ceramic material: $BaTiO_3$
Thickness (design value) of ceramic portion: 0.9 μm
Material of inner electrode: Ni
Thickness (design value) of inner electrode: 0.6 μm
Total number of inner electrodes: 45
Firing conditions: holding at 1200° C. for 2 hours
Capacitance of ceramic electronic component: 0.47 μF
Rated working voltage of ceramic electronic component: 6.3 V
Thickness (design value) of glass coating layer 15: 8 μm
First and second metal powder particles 15a1 and 15a2 contained in glass coating layer 15: Cu powder particles
Aspect ratio of first metal powder particles in glass coating layer: 8
Aspect ratio of second metal powder particles in glass coating layer: 1.5
Average particle diameter (preparation value) of first metal powder particles (flat powder particles): 3.5 μm ($D_{50}$)
Average particle diameter (preparation value) of second metal powder particles (spherical powder particles): 0.5 μm ($D_{50}$)
Main component of glass powder particles in glass paste: borosilicate glass
Softening point of glass in glass paste: 600° C.
Average particle diameter of glass powder particles: 1 μm
Ratio of sum of first and second metal powder particles and glass in glass coating layer: 52.5 vol %/47.5 vol % (detected from sample)
Ratio of glass powder particles in solid content of glass paste: 57.5 vol %/42.5 vol % (preparation value)
Heat treatment condition: 680° C.
Plating film: A Cu film (thickness: 4 μm), a Ni film (thickness: 3 μm), and a Sn film (thickness: 4 μm) were formed on the glass coating layer 15.

Measurement of Coverage with Plating Film

Twenty samples of each ceramic electronic component 1 having a volume ratio of the first and second metal powder particles 15a1 and 15a2 in the glass coating layer 15 as shown in Table below were produced. In the production of each of the samples, the coverage (%) of the glass coating layer 15 with a Cu plating film was measured in the case where the Cu plating film was formed by applying an electric current of 3 A for 90 minutes. Table shows the results.

The coverage (%) with the Cu plating film was measured by the following method. In the SEM observation (2000 times, acceleration voltage: 15 kV) at the center of the first terminal electrode on the first principal surface of each sample, a reflected electron image was binarized and the percentage (%) of the area occupied by the Cu plating film when a field of view of 50 μm×50 μm was assumed to be 100% was determined for each of the 20 samples. The average of the percentages was defined to be a coverage (%). The aspect ratios of the first and second metal powder particles 15a1 and 15a2 were determined by the above-described measurement method.

The ratio of the first metal powder particles and the second metal powder particles can be calculated to be as follows. An LT surface of each sample was polished in the length direction L until a cross section at the center (½ of W dimension) of the sample appeared to expose cross sections of the terminal electrodes. A portion of the glass coating layer located in a field of view of 30 μm×30 μm at the center of the end surface of one of the terminal electrodes was then observed with a SEM at a magnification of 5000 times at an acceleration voltage of 15 kV. In the SEM observation of the cross section, powder particles having an aspect ratio (major axis/minor axis) of more than 3.5, which was calculated by the above-described method, were defined to be first metal powder particles and the ratio of the first metal powder particles and the second metal powder particles was calculated. The Table below shows the average of the ratios of five samples calculated by the above-described method.

Measurement of Cap in 0Ω Discharge

The initial Cap of each sample was measured using an LCR meter (manufactured by Agilent Technologies). Subsequently, the voltage application (5 seconds×5 times) at 20 V and the discharge were repeatedly performed and then the Cap was measured again. Samples whose Cap after the voltage application and the discharge were repeatedly performed was decreased by 5% or more with respect to the initial Cap were defined to be "not good samples". The Table below shows the results.

TABLE

| Ratio of first metal powder particles (flat powder particles) (vol %) | 100 | 92 | 76 | 65 | 48 |
|---|---|---|---|---|---|
| Ratio of second metal powder particles (spherical powder particles) (vol %) | 0 | 8 | 24 | 35 | 52 |
| Coverage with Cu plating film (%) | 98 | 96 | 92 | 93 | 85 |
| Evaluation of Cap in 0 Ω discharge (ratio of "not good samples") | 3/20 | 0/20 | 0/20 | 0/20 | 0/20 |

As described above, in this preferred embodiment, the metal powder particles 15a preferably include the first metal powder particles 15a1, which are flat powder particles. Therefore, the exposed area of the first metal powder particles 15a1 increases at the surface of the glass coating layer 15, which increases the coverage of the surface of the glass coating layer 15 with a plating film. As a result, the plating film can be formed within a short time and a plating process can be made efficient. Furthermore, the growth of the plating film in the thickness direction is significantly reduced or prevented and thus the sizes of electronic components are decreased. In this preferred embodiment, the metal powder particles 15a also preferably include the second metal powder particles 15a2, which are spherical powder particles. Therefore, the second metal powder particles 15a2 easily enter the gaps between the first metal powder particles 15a1, and the first metal powder particles 15a1 are electrically connected to each other. This provides good electrical connection in the glass coating layer 15.

The above-described effects are more significantly achieved when the ratio of the second metal powder particles in the metal powder particles is about 5% to about 50% by volume and preferably about 8% to about 35% by volume, for example.

Other examples of preferred embodiments of the present invention will now be described. In the following description, members having the same or substantially the same functions as those in the first preferred embodiment are denoted by the same reference numerals and the descriptions thereof are omitted.

Second Preferred Embodiment

Figure 11:
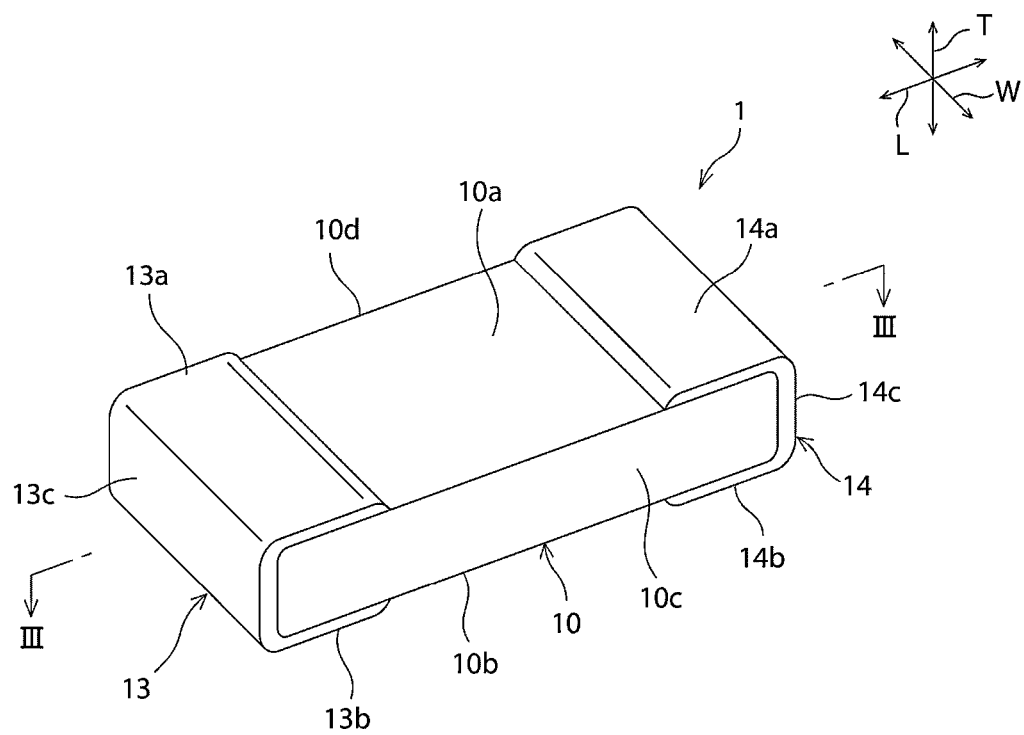
FIG. 11 is a schematic perspective view of a ceramic electronic component according to a second preferred embodiment of the present invention.

FIG. 11 is a schematic perspective view of a ceramic electronic component according to a second preferred embodiment of the present invention.

In the first preferred embodiment, an example in which the first and second terminal electrodes 13 and 14 and the glass coating layers 15 are located on the first and second side surfaces 10c and 10d has been described. However, as illustrated in FIG. 11, the first and second terminal electrodes 13 and 14 and the glass coating layers 15 are not necessarily formed on the first and second side surfaces 10c and 10d, for example.

Figure 12:
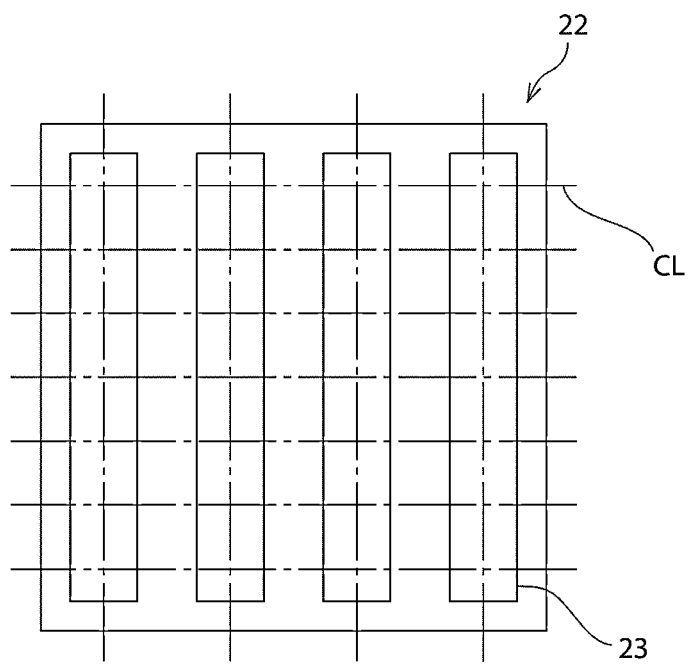
FIG. 12 is a schematic plan view of a mother multilayer body.

The ceramic electronic component according to the second preferred embodiment can be produced by, for example, the following method. A mother multilayer body 22 (refer to FIG. 12) is obtained in the same manner as the method for producing the ceramic electronic component 1 according to the first preferred embodiment. In this preferred embodiment, as illustrated in FIG. 12, a conductive pattern 23 having a shape corresponding to first and second portions 13a, 13b, 14a, and 14b of the first and second terminal electrodes 13 and 14 is then formed on the mother multilayer body 22 by an appropriate printing method such as a screen printing method. A plurality of green ceramic multilayer bodies are produced from the mother multilayer body 22 by cutting the mother multilayer body 22 along an imaginary cutting line CL.

Subsequently, each of the green ceramic multilayer bodies is fired. A glass paste is then applied onto both end surfaces of the ceramic multilayer body. The glass paste is then heat-treated to form a glass coating layer 15 having a shape corresponding to each of third portions 13c and 14c of the first and second terminal electrodes 13 and 14. After that, plating films are formed on the glass coating layers 15 to provide the first and second terminal electrodes 13 and 14. Thus, a ceramic electronic component according to the second preferred embodiment can be produced.

The conductive pattern 23 provided in the first and second portions 13a, 13b, 14a, and 14b of the first and second terminal electrodes 13 and 14 is different from the glass paste applied in the third portions 13c and 14c of the first and second terminal electrodes 13 and 14 in terms of the types of metal and inorganic filler. For example, the conductive pattern 23 contains Ni and the same ceramic material as the ceramic material contained in the ceramic body 10.

Third Preferred Embodiment

Figure 13:
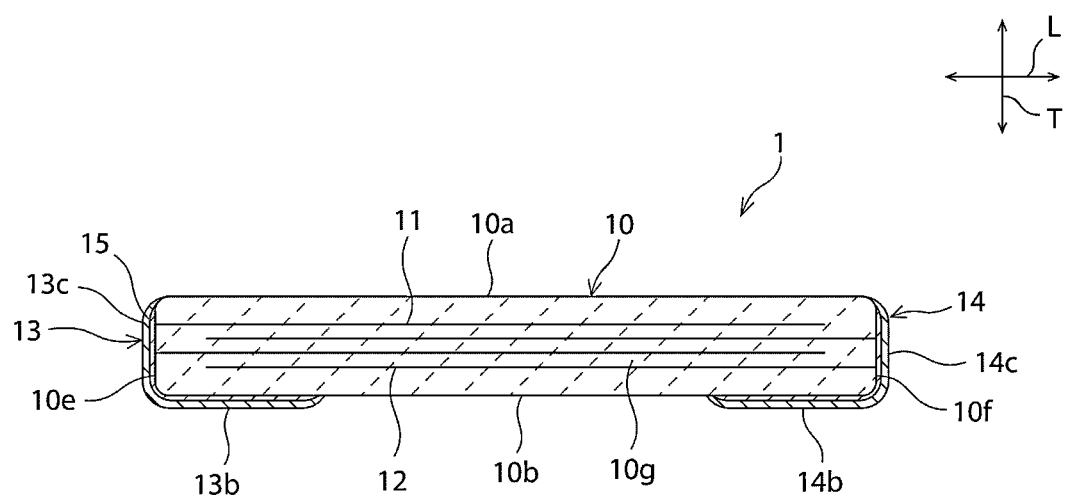
FIG. 13 is a schematic sectional view of a ceramic electronic component according to a third preferred embodiment of the present invention.

FIG. 13 is a schematic sectional view of a ceramic electronic component according to a third preferred embodiment of the present invention.

In the first preferred embodiment, an example in which the first and second terminal electrodes 13 and 14 and the glass coating layers 15 are provided on the first and second principal surfaces 10a and 10b has been described. However, the present invention is not limited to the structure. The first and second terminal electrodes 13 and 14 and the glass coating layers 15 may each be provided in any portion on the surface of the ceramic body 10.

For example, as illustrated in FIG. 13, the first and second terminal electrodes 13 and 14 and the glass coating layers 15 may be provided on only the second principal surface 10b among the first and second principal surfaces 10a and 10b.

Fourth Preferred Embodiment

Figure 14:
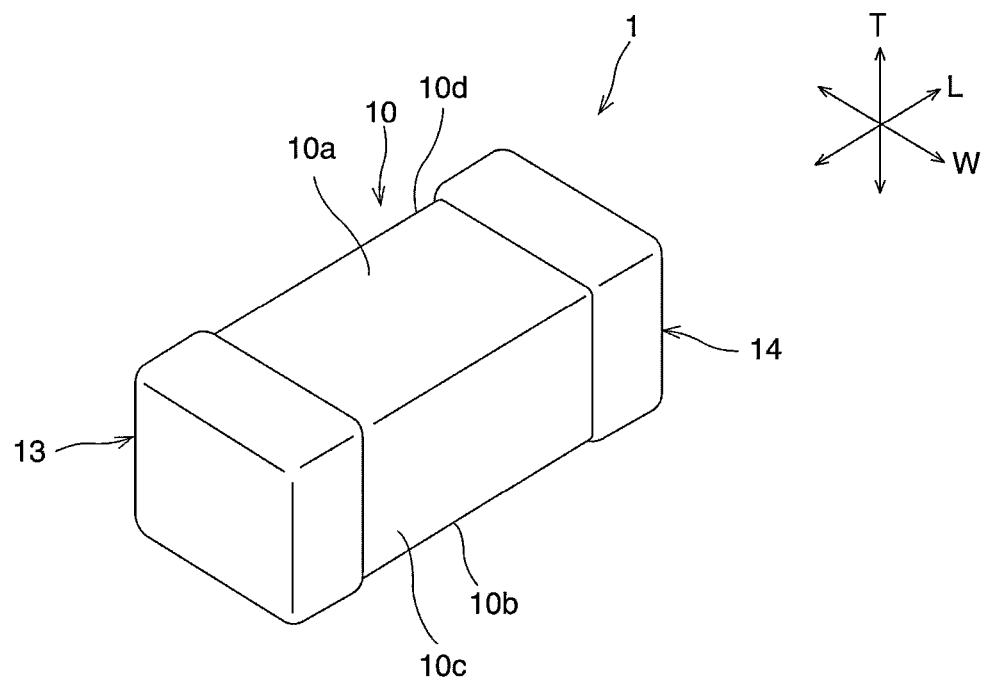
FIG. 14 is a schematic perspective view of a ceramic electronic component according to a fourth preferred embodiment of the present invention.

FIG. 14 is a schematic perspective view of a ceramic electronic component according to a fourth preferred embodiment of the present invention.

In the first preferred embodiment, an example in which, when the ceramic body 10 is assumed to have a thickness $D_T$, a length $D_L$, and a width $D_W$, $D_T<D_W<D_L$ is satisfied has been described. However, as illustrated in FIG. 14, $D_W \leq D_T<D_L$ may be satisfied.

As described above, preferred embodiments of the present invention provide a ceramic electronic component having excellent moisture resistance because portions of a ceramic body in which inner electrodes are exposed are each covered with a glass coating layer.

Thus, since portions of a ceramic body in which inner electrodes are exposed are each covered with a glass coating layer, preferred embodiments of the present invention can be widely applied to various multilayer ceramic electronic components.

For example, when the ceramic electronic component is a piezoelectric ceramic element, the ceramic body can be formed of a piezoelectric ceramic material. A specific example of the piezoelectric ceramic material is a lead zirconate titanate (PZT) ceramic material.

When the ceramic electronic component is a thermistor element, the ceramic body can be formed of a semiconductor ceramic material. A specific example of the semiconductor ceramic material is a spinel-type ceramic material.

When the ceramic electronic component is an inductor element, the ceramic body can be formed of a magnetic ceramic material. A specific example of the magnetic ceramic material is a ferrite ceramic material.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A ceramic electronic component comprising:
   a ceramic body including a surface at which an end portion of an inner electrode is exposed;
   a glass coating layer that covers a portion of the ceramic body at which the inner electrode is exposed; and
   a terminal electrode disposed directly above the glass coating layer and including a plating film; wherein
   the glass coating layer includes a glass medium and metal powder particles that are dispersed in the glass medium and define conductive paths which electrically connect the inner electrode and the terminal electrode;
   the metal powder particles include first metal powder particles, which are flat or substantially flat powder par- ticles, and second metal powder particles, which are spherical or substantially spherical powder particles; and the conductive paths include a plurality of relatively narrow portions and a plurality of relatively thick portions.

2. The ceramic electronic component according to claim 1, wherein an aspect ratio of the first metal powder particles in a cross section of the glass coating layer in a thickness direction is about 3.6 or more.

3. The ceramic electronic component according to claim 1, wherein a ratio of the second metal powder particles in the metal powder particles is about 5% by volume to about 50% by volume.

4. The ceramic electronic component according to claim 1, wherein a ratio of the second metal powder particles in the metal powder particles is about 8% by volume to about 35% by volume.

5. The ceramic electronic component according to claim 1, wherein at least one of the conductive paths is defined by the metal powder particles arranged in contact with each other, and the metal powder particles is arranged in a thickness direction of the glass coating layer.

6. The ceramic electronic component according to claim 1, wherein the metal powder particles do not contain, as a main component, a metal contained in the inner electrode as a main component.

7. The ceramic electronic component according to claim 1, wherein the metal powder particles include at least a core portion including copper.

8. The ceramic electronic component according to claim 1, wherein the glass coating layer has a thickness of about 1 μm to about 10 μm.

9. The ceramic electronic component according to claim 1, wherein a portion of the plating film in contact with the glass coating layer is a copper plating film or a nickel plating film.

10. A ceramic electronic component comprising:
a ceramic body including a surface at which an end portion of an inner electrode is exposed;
a glass coating layer that covers a portion of the ceramic body at which the inner electrode is exposed; and
a terminal electrode disposed directly above the glass coating layer and including a plating film; wherein
the glass coating layer includes a glass medium and metal powder particles that are dispersed in the glass medium and define conductive paths which electrically connect the inner electrode and the terminal electrode;
the metal powder particles include first metal powder particles having an elongated or substantially elongated shape in a cross section of the glass coating layer in a thickness direction and second metal powder particles, an average of ratios of a major axis to a minor axis of the second metal powder particles is smaller than that of the first metal powder particles in the cross section of the glass coating layer in the thickness direction; and
the conductive paths include a plurality of relatively narrow portions and a plurality of relatively thick portions.

11. The ceramic electronic component according to claim 10, wherein an aspect ratio of the first metal powder particles in a cross section of the glass coating layer in a thickness direction is about 3.6 or more.

12. The ceramic electronic component according to claim 10, wherein a ratio of the second metal powder particles in the metal powder particles is about 5% by volume to about 50% by volume.

13. The ceramic electronic component according to claim 10, wherein a ratio of the second metal powder particles in the metal powder particles is about 8% by volume to about 35% by volume.

14. The ceramic electronic component according to claim 10, wherein at least one of the conductive paths is defined by the metal powder particles arranged in contact with each other, and the metal powder particles is arranged in a thickness direction of the glass coating layer.

15. The ceramic electronic component according to claim 10, wherein the metal powder particles do not contain, as a main component, a metal contained in the inner electrode as a main component.

16. The ceramic electronic component according to claim 10, wherein the metal powder particles include at least a core portion including copper.

17. The ceramic electronic component according to claim 10, wherein the glass coating layer has a thickness of about 1 μm to about 10 μm.

18. A glass paste for forming a glass coating layer that covers a region in which a terminal electrode of a ceramic electronic component including a ceramic body and the terminal electrode is to be disposed, the glass paste comprising:
a glass medium; and
metal powder particles; wherein
the glass paste forming the glass coating layer covers a portion of the ceramic body at which an inner electrode of the ceramic body is exposed;
the metal powder particles are dispersed in the glass medium and define conductive paths which electrically connect the inner electrode and the terminal electrode;
the metal powder particles include first metal powder particles, which are flat or substantially flat powder particles, and second metal powder particles, which are spherical or substantially spherical powder particles; and
the conductive paths include a plurality of relatively narrow portions and a plurality of relatively thick portions.

19. A glass paste for forming a glass coating layer that covers a region in which a terminal electrode of a ceramic electronic component including a ceramic body and the terminal electrode is to be disposed, the glass paste comprising:
a glass medium; and
metal powder particles; wherein
the glass paste forming the glass coating layer covers a portion of the ceramic body at which an inner electrode of the ceramic body is exposed;
the metal powder particles are dispersed in the glass medium and define conductive paths which electrically connect the inner electrode and the terminal electrode;
the metal powder particles include first metal powder particles having an elongated or substantially elongated shape in a cross section that is to be obtained when the glass coating layer is formed and extends in a thickness direction and second metal powder particles;
an average of ratios of a major axis to a minor axis of the second metal powder particles is smaller than that of the first metal powder particles in the cross section that is to be obtained when the glass coating layer is formed and extends in the thickness direction; and
the conductive paths include a plurality of relatively narrow portions and a plurality of relatively thick portions.

* * * * *